United States Patent [19]
Hasegawa et al.

[11] Patent Number: 5,316,620
[45] Date of Patent: May 31, 1994

[54] METHOD AND AN APPARATUS FOR POLISHING WAFER CHAMFERS

[75] Inventors: Fumihiko Hasegawa, Urawa; Tatsuo Ohtani; Hiroshi Kawano, both of Fukushima; Masayuki Yamada, Shirakawa, all of Japan

[73] Assignee: Shin-Etsu Handotai Co., Ltd., Tokyo, Japan

[21] Appl. No.: 7,888

[22] Filed: Jan. 22, 1993

[30] Foreign Application Priority Data

Jan. 24, 1992 [JP] Japan ................................... 4-032859

[51] Int. Cl.⁵ ..................... B44C 1/22; H01L 21/306; H01L 21/463
[52] U.S. Cl. .................................. 156/645; 156/636; 156/662; 156/345; 437/225; 51/281 R; 51/2 R; 51/DIG. 15
[58] Field of Search ............... 156/636, 637, 645, 657, 156/662, 345; 437/225, 974, 231, 947; 51/281 R, 283 R, 283 E, 284 E, DIG. 15, 2 R, 3, 71, 79

[56] References Cited
U.S. PATENT DOCUMENTS

| | | | |
|---|---|---|---|
| 4,897,369 | 1/1990 | Beretta et al. | 437/225 |
| 5,110,764 | 5/1992 | Ogino | 437/224 |
| 5,128,281 | 7/1992 | Dyer et al. | 437/225 |

*Primary Examiner*—William Powell
*Attorney, Agent, or Firm*—Lowe, Price, LeBanc & Becker

[57] ABSTRACT

A method for polishing peripheral chamfers of a semiconductor wafer comprising steps of: (a) turning a cylindrical cup-like rotatory buff having an internal polish groove formed in the inner wall surface thereof, the groove having a profile complementary to the profile of the chamfered wafer edge to be polished; (b) disposing the wafer inside the turning buff; (c) turning the wafer at a relatively low rate; and (d) pressing the wafer edge into the running internal polish groove with an appropriate pressure; furthermore there is proposed an apparatus for this novel method including the cylindrical cup-like rotatory buff as described above.

14 Claims, 6 Drawing Sheets

METHOD AND AN APPARATUS FOR POLISHING WAFER CHAMFERS

BACKGROUND OF THE INVENTION

The present invention relates to a method and an apparatus for polishing chamfers of a wafer.

1. Prior Art

A semiconductor wafer, which is used to make substrates for semiconductor devices, is obtained from a single crystal ingot, such as one grown of molten polycrystal silicon, by slicing the ingot into thin disks orthogonally to the axis of the ingot, which disks are then chambered, lapped, etched, annealed, polished, and given other finishing treatments.

Each semiconductor wafer, as produced in the manner generally described above, is chamfered along the peripheral edge thereof so as to remove any sharpness from the edge and thereby fashion the wafer edge difficult to chip. However, due to the increased demand for stricter prevention of dust creation called for by highly developed super LSI (large scale integration) technology based on high precision machining, the current tendency is to polish the chamfers of wafer periphery until they are glossy (specular finish polishing) so as to nullify the possibility of creation of particles due to microscopic chipping.

Figure 7:
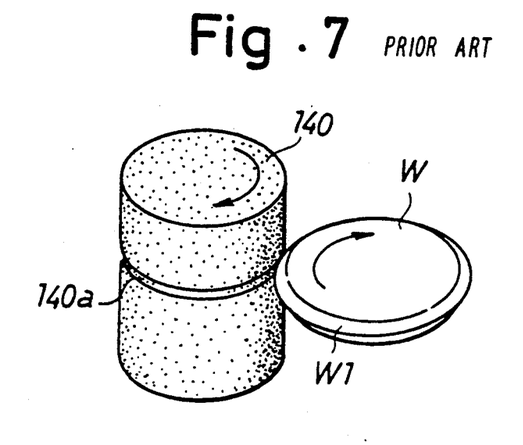
FIG. 7 is a perspective view showing how the conventional external surface-contact type cylindrical polishing is conducted.

Incidentally, a wafer is usually formed with a cut-away portion where the wafer edge line is straight and this edge portion is conventionally called an orientation flat (OF for short), and when the wafer is chamfered and polished, the entire periphery including the OF is made glossy. Conventionally, the circular circumference portion as well as the straight-line OF portion of the wafer edge is polished by means of an external surface-contact type cylindrical polisher. FIG. 7 shows a manner of employing one of such external surface-contact type cylindrical polisher, which consists of a buff 140 made of a resilient body and formed with a groove 140a, which extends around the side of the cylinder describing a circle normal to the axis of the cylinder. The profile of the groove 140a is about complementary to the profile of the chamfered wafer edge so they fit each other when they are in contact.

The buff 140 is turned about the axis of rotation and the wafer being turned in the same angular direction as the buff 140 is brought so that the wafer edge enters the groove 140a. Slurry (polishing liquid) is applied to the running groove 140a, and the running edge of the wafer W is pressed in the groove 140a of the cylindrical buff 140, whereby the chamfers W1 of the wafer W are polished.

2. Problems the Invention seeks to solve

However, in such polishing method wherein an external surface-contact type cylindrical polisher (buff 140) is employed, the contact between the wafer edge and the side of the cylindrical buff is of convex-to-convex type so that the area of the wafer chamfers W1 contacted at any moment by the buff 140 is meager. Thus, the time efficiency of polishing work effected on the wafer chamfers W1 by the buff 140 is low, so that the time required for effecting the specular finish polishing is relatively long, and the wafer production efficiency is restricted.

The present invention was contrived in view of this problem, and it is, therefore, an object of the invention to provide an improved method and apparatus for polishing chamfers of a wafer in a manner such that the required polishing time will be reduced and the wafer production efficiency improved.

With this object in mind the inventors conducted a theoretical study of comparing the polishing time required for specular finish in the case of a novel internal surface-contact type buff (convex-to-concave contact) with that in the case of the conventional external surface-contact type cylindrical buff (convex-to-convex contact). The study will be described with reference to FIG. 8(a) and FIG. 9(a); in FIG. 8(a) a wafer W with exaggerated thickness is seen to be inscribed to the internal surface of an internal surface-contact type buff 240, and in FIG. 9(a) a wafer W with exaggerated thickness is seen to be in contact with the external surface of an external surface-contact type cylindrical buff 240.

The rate of reduction (removal) of roughness R of the chamfers of a wafer W is considered to be proportionate to the roughness R itself and to the length L of the area of contact between the wafer W and the buff 240 measured in the direction of brushing (polishing); hence, the following equation holds:

$$dR/dt = -KLR \qquad (1)$$

wherein K is a coefficient determined by the contact pressure, relative velocity at the contact point, slurry condition, etc; t is time during which the polishing is conducted, and L is the length of the contact area.

The above equation is rewritten into a following differential equation:

$$dR/R = -KLdt \qquad (2).$$

And by solving this differential equation, we obtain a following equation, $$\log R/R_0 = -KLt \qquad (3)$$

wherein $R_0$ is the initial roughness of the chamfers (i.e., the roughness at $t=0$, or $R_{t=0}$).

Consequently, the roughness R of the wafer chamfers at any moment is given as a function of polishing time t:

$$R = R_0 e^{-KLt} \qquad (4).$$

Figure 8A:
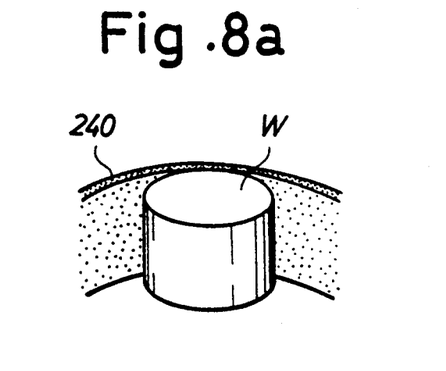
Figure 8B:
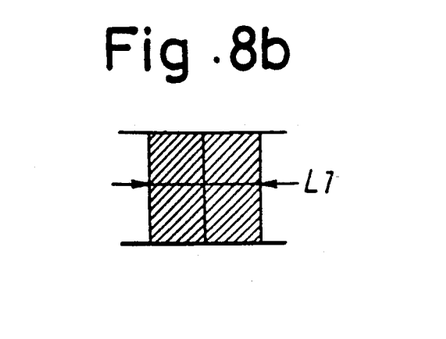
Figure 9A:
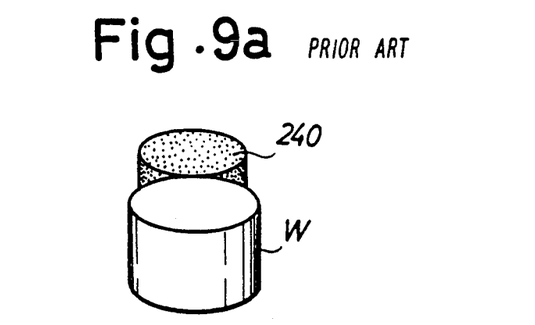
Figure 9B:
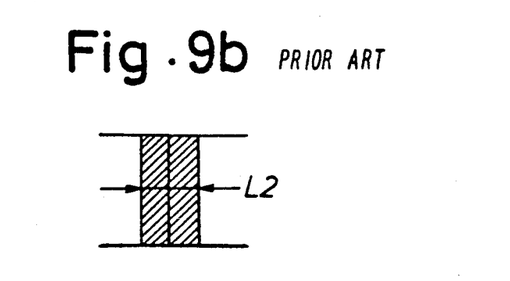

According to the theory of elastic contacts, the length L1 of the contact area in the case where the wafer edge is inscribed by the internal polishing surface of an internal surface-contact type buff 240 (convex-to-concave contact), shown in FIG. 8(a), is substantially greater than the length L2 of the contact area in the case where the wafer edge contacts the side surface of the cylindrical buff 240 (convex-to-convex contact), shown in FIG. 9(a); and such result is intuitively confirmable, as shown in FIG. 8(b) and FIG. 9(b) (L1>L2). Also, it is intuitively confirmable that, in the case of convex-to-concave contact, the closer the radius of curvature of wafer to that of the internal polishing surface without exceding it, the greater the length L of the contact.

Figure 10:
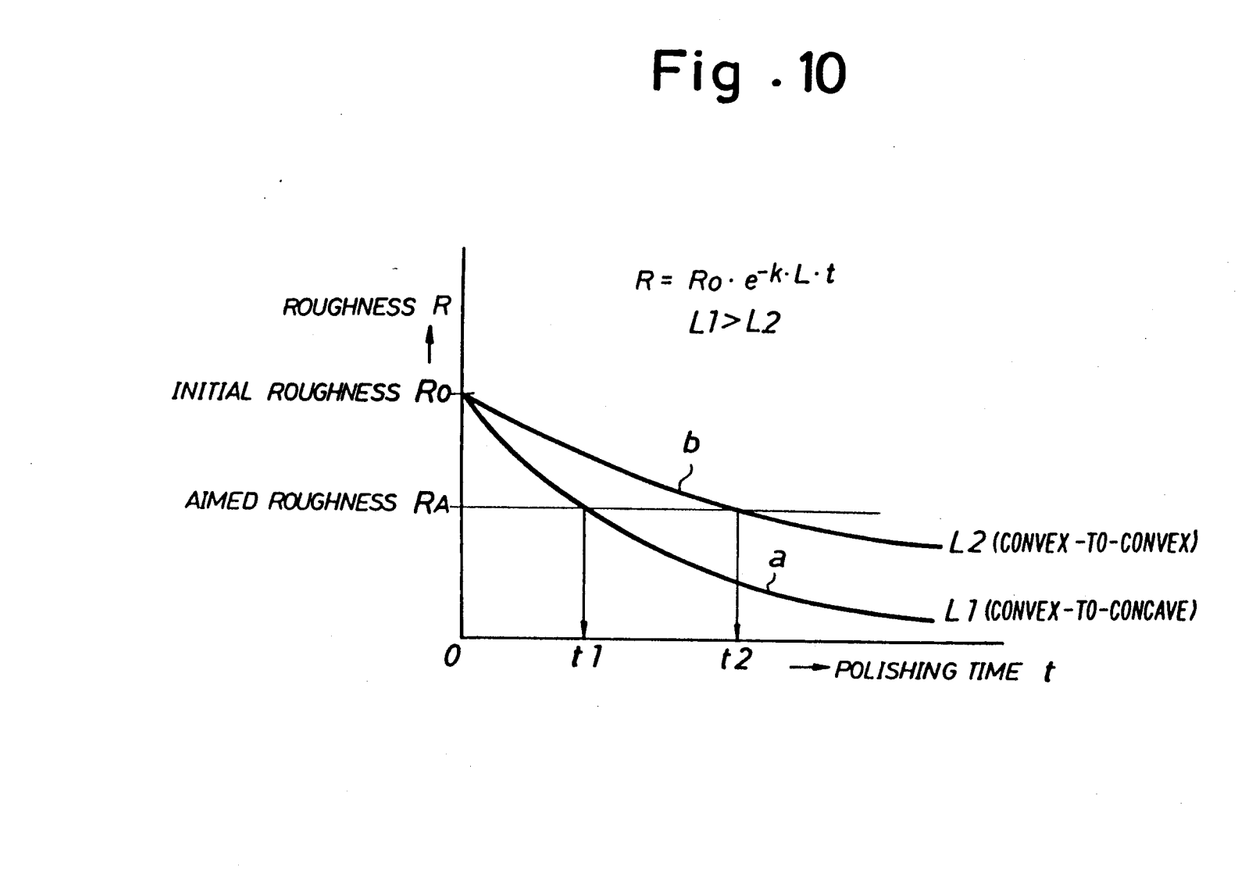
FIG. 10 is a graph wherein reduction of the roughness of wafer chamfers with time is plotted in the cases of convex-to-concave contact polishing (L1) and convex-to-convex contact polishing (L2).

Values of roughness R of the wafer chamfers at different times t are calculated by means of equation (4) both in the case of convex-to-concave contact and in the case of convex-to-convex contact, and the results are plotted in FIG. 10 to show the variation of the roughness R of the wafer chamfers with time. In FIG. 10, curve a corresponds to the case of convex-to-concave contact (L1) and curve b corresponds to the case of convex-to-convex contact (L2). Suppose it is desired that roughness R is reduced to a low level value of $R_A$; then, the polishing time t required to attain roughness $R_A$ is t1 in the case of convex-to-concave contact and t2 in the case of convex-to-convex contact, and t2 is definitely greater than t1. Hence, the time efficiency of polishing is higher in the case of convex-to-concave contact polishing where a long contact length L1 is obtained than in the case of convex-to-convex contact polishing where the contact length L2 is relatively small. Thus, a change to convex-to-concave type polishing from convex-to-convex type polishing will shorten the required polishing time t and contribute to a sharp increase in wafer productivity.

The inventors, therefore, contrived their novel method and apparatus for polishing chamfers of a wafer based on this concept.

SUMMARY OF THE INVENTION

Means to Solve the Problems

Herein is proposed, therefore, a novel method for polishing peripheral chamfers of a semiconductor wafer comprising steps of:

(a) turning about its axis of rotation at a relatively high rate a cylindrical cup-shaped rotatory buff having an internal polish groove formed in the inner wall surface thereof, said groove describing a circle normal to the axis of rotation of said cylindrical buff and having a profile complementary to the profile of the chamfered wafer edge;

(b) disposing the wafer inside the turning cylindrical buff in a manner such that the wafer lies in the plane defined by the circle of said internal polish groove;

(c) turning said wafer circumferentially at a relatively low rate; and (d) moving said wafer radially to press the wafer edge into the running internal polish groove with an appropriate pressure.

In the case where the wafer is one that has a straight-line orientation flat edge, then it is preferred that said cylindrical rotatory buff also has an external polish groove formed in the outer wall surface thereof describing a circle normal to the axis of rotation of said cylindrical buff and having a profile complementary to the profile of the chamfered wafer edge, and the method further comprises additional steps of:

(i) disposing said wafer outside said cylindrical rotatory buff in a manner such that the wafer lies in the plane defined by the circle of said external polish groove;

(ii) moving said wafer toward the buff in a manner such that the orientation flat edge of the wafer is contacted by the turning buff in a way that the the orientation flat edge is orthogonally bisected by the line that connects the centers of the wafer and the circle described by said external polish groove, to press the orientation flat edge into the external polish groove with an appropriate pressure; and (iii) stroking said orientation flat edge of the wafer on the running external polish groove.

At step (iii) in a preferred embodiment, the wafer is swung circumferentially at a relatively low rate through the angle included between the radii connecting the center of the wafer with the end points of the orientation flat edge. Or in another embodiment, the wafer is reciprocated repeatedly in a manner such that the entire orientation flat edge is slid on the running external polish groove in a direction generally tangential to the circle of the external polish groove at the contact point.

Preferably, the circle described by said external polish groove lies substantially in the same plane as the circle described by said internal polish groove. Another aspect of the invention lies in the novel apparatus for polishing peripheral chamfers of a semiconductor wafer, wherein the cylindrical cup-shaped rotatory buff as described above is employed.

Effects of the Invention

According to the invention, therefore, since a cylindrical cup-like rotatory buff having an internal polish groove formed in the inner wall surface thereof is employed and the wafer edge is polished in this polish groove, the contact of the wafer to the buff is of convex-to-concave type so that the polish contact area of the wafer edge at any time point becomes greater than the contact area in the conventional procedure; as a result, the polishing rate of the buff is improved and, therefore, the wafer productivity is improved.

These and other objects and effects of the invention will become more apparent in the detailed description, taken in connection with the accompanying drawings.

BRIEF DESCRIPTION OF THE DRAWINGS

FIG. 6 shows: (a) a partial perspective view of a wafer, illustrating the shape of a contact area of wafer peripheral chamfers, (b) the development of a contact area of wafer peripheral chamfers in the case of the inventive internal surface-contact type polishing (convex-to-concave contact), and (c) the development of a contact area of wafer peripheral chamfers in the case of the conventional external surface-contact type cylindrical polishing (convex-to-convex contact);

FIG. 8 is: (a) a perspective view showing how the inventive internal surface-contact type polishing is conducted, and (b) a drawing showing the length of the area of contact between the wafer and the internal surface of polisher measured in the direction of brushing;

FIG. 9 is: (a) a perspective view showing how the conventional external surface-contact type cylindrical polishing is conducted, and (b) a drawing showing the length of the area of contact between the wafer and the external surface of polisher measured in the direction of brushing.

EMBODIMENTS

Next, an embodiment of the present invention, considered as the best mode, will be described with reference to the attached drawings.

Figure 1:
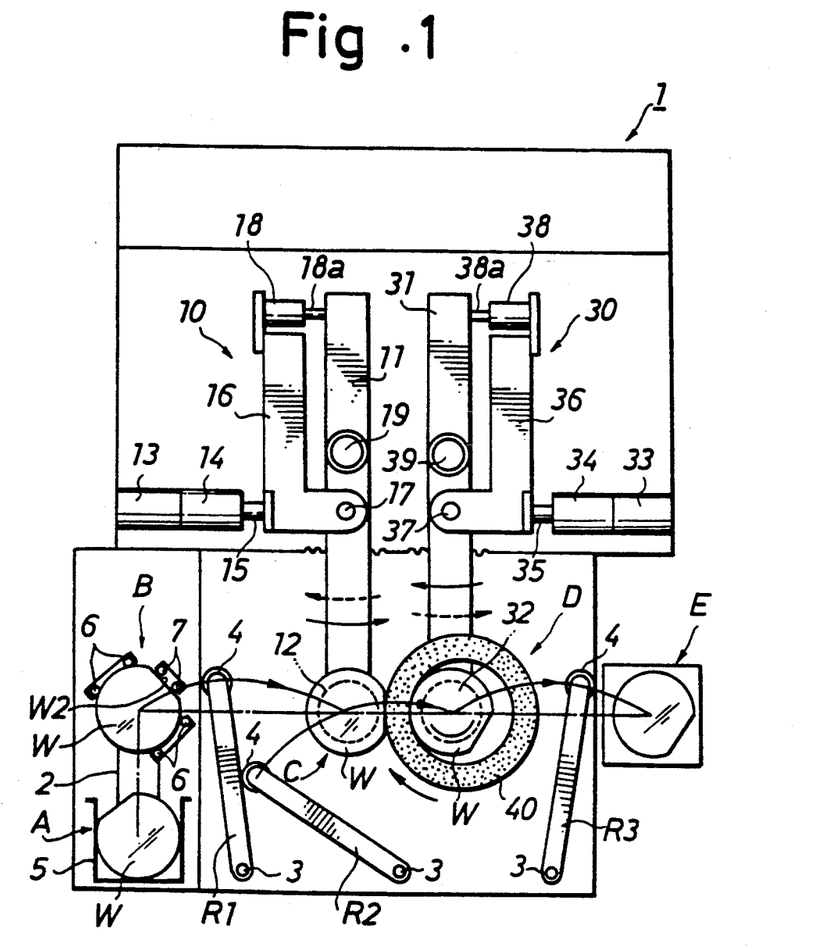
FIG. 1 is a top plan view of an apparatus, according to the present invention, for polishing wafer chamfers.
Figure 2:
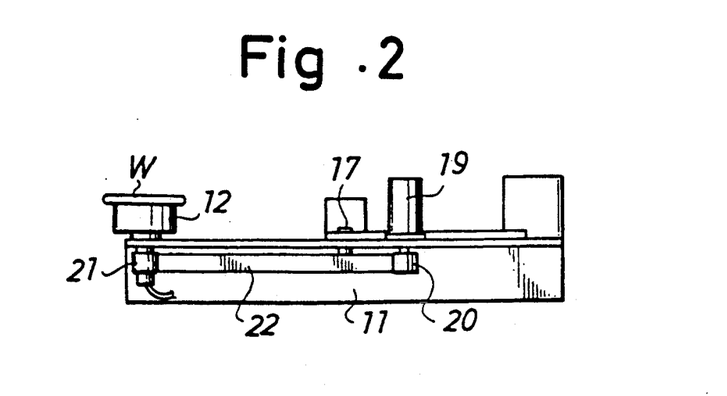
FIG. 2 is a side view of a wafer transportation means of the wafer chamfer polishing apparatus of the invention.
Figure 3:
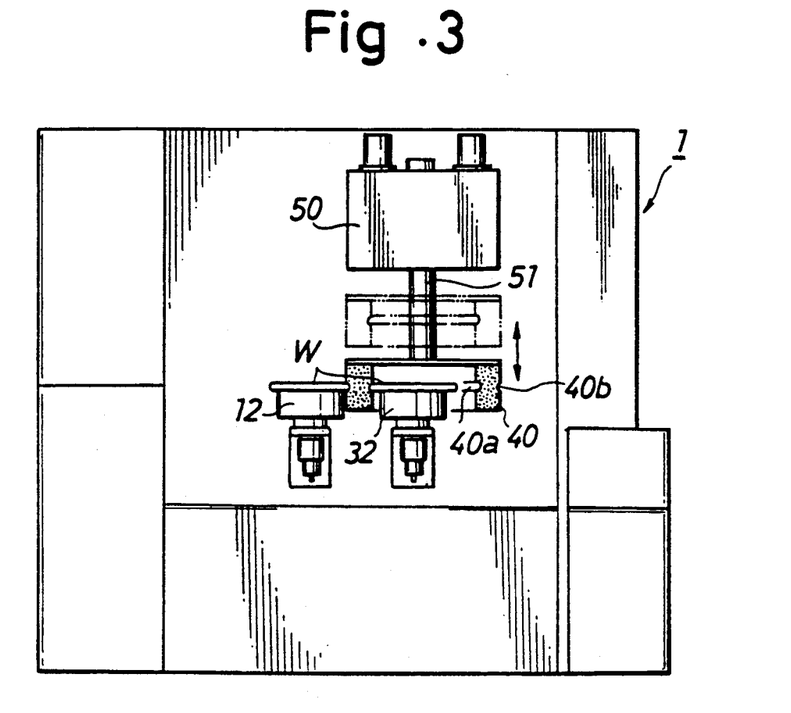
FIG. 3 is a front view of the wafer chamfer polishing apparatus of the invention.

FIG. 1 is a top plan view of a wafer polishing apparatus, according to the invention; FIG. 2 is a side view of a wafer transportation means of the same apparatus; and FIG. 3 is a front view of the same apparatus.

As shown in FIG. 1, a wafer chamfers polishing apparatus 1 of the present invention is composed mainly of a loader assembly A, an OF position orienting assembly B, an OF polishing stage C, a circular circumference polishing stage D, and an unloader assembly E. A conveyor 2, which conveys wafers from the loader assembly A to the OF position alignment assembly, is provided between the loader assembly A and the OF position alignment assembly. A swing arm R1 is pivotally installed at a suitable location for carrying wafers from the OF position orienting assembly B to the OF polishing stage C. Similar swing arms R2 and R3 are installed separately for carrying wafers, respectively, from the OF polishing stage C to the circular circumference polishing stage D, and from the circular circumference polishing stage D to the unloader assembly E. These swing arms R1, R2, R3 are transportation robots adapted to swing about respective pivots 3, and are each provided with a suction cup 4 for sucking and fixing a wafer W on it at the fore (free) end.

A wafer cassette 5 is installed at the loader assembly A, and contains a plurality of wafers W which are piled up in horizontal layers (piled toward you as you see FIG. 1) at regular intervals.

At the OF position orienting assembly B are provided two pairs of touch rollers 6 for touching and driving the circular circumference of a wafer W to thereby turn the wafer W circumferentially. Also provided at the assembly B are a pair of positioning pins 7 for orienting the wafer by touching and holding the straight-line OF edge W2.

At the OF polishing stage C is disposed a suction head 12 provided at the fore end of an arm 11 of a wafer press means 10. The suction head 12 is adapted to receive a wafer W from the swing arm R1 by sucking at the wafer W, and to press the OF edge W2 onto the external surface of a hollow cylindrical buff 40. The suction head 12 is connected to a vacuum pump, not shown.

The wafer press means 10 has a servo motor 13 and a ball screw mechanism 14, which is driven by the servo motor 13; at the fore end of a rod 15 extending from the ball screw mechanism 14 is connected an L-letter shaped stay 16. At one end portion of the stay 16 is pivotally connected the middle portion of the arm 11 by means of a pivot 17, and a rod 18a extending from an air cylinder 18 fixed to the other end of the stay 16 is connected orthogonally to the arm 11 at that end portion of the arm 11 which is not provided with the suction head 12.

At a location slightly away from the pivot 17 toward the rod 18a is installed a motor 19, and as shown in FIG. 2, at the lower end of the output shaft extending vertically downward from the motor 19 is connected a pulley 20. A drive belt 22 is passed round this pulley 20 on one hand and round a pulley 21 on the other, which 21 is connected at the lower end of a rotatory shaft extending vertically downward from the suction head 12.

At the circular circumference polishing stage D are disposed a suction head 32 provided at the fore end of an arm 31 of a wafer press means 30 and the cylindrical buff 40. The suction head 32 is adapted to receive the wafer W from the swing arm R2 by sucking at the wafer W, and to press the circular circumference of the wafer W onto the internal surface of a hollow cylindrical buff 40. The construction of the wafer press means 30 is similar to that of the wafer press means 10: reference numeral 33 designates a servomotor, 34 a ball screw mechanism, 35 a rod, 36 a stay, 37 a pivot, 38 an air cylinder, 38a a rod extending from the air cylinder 38, and 39 a motor.

The hollow cylindrical buff 40 is a hollow cylinder with the closed top and the open bottom. The internal surface of the buff cylinder is formed with a polish groove 40a, which extends all round the inner wall describing a circle normal to the axis of the cylinder. The profile of the groove 40a is about complementary to the profile of the chamfered wafer edge W1 at circular circumference so they fit each other when they are in contact. The external surface of the buff cylinder is formed with a polish groove 40b, which extends all round the outer wall describing a circle normal to the axis of the cylinder. (In this embodiment the inner polish groove 40a and the outer polish groove 40b are formed at the same level.) The profile of the groove 40b is about complementary to the profile of the chamfered wafer edge W2 at OF. The buff 40 need be made of a material having a proper degree of elasticity (resilience), a surface roughness sufficient to retain fine particles of the polishing slurry, and physical as well as chemical strength sufficient to withstand the corrosiveness of the slurry and the pressure by which the wafer edge is urged in the grooves; therefore, the buff is preferably made of polyurethane, which is commonly called as artificial leather.

To the center of the top disk plate with which the cylindrical buff 40 is roofed is connected the lower end of a rotatory shaft 51 extending vertically downward from a buff drive means 50 installed above the buff 40. Now, the construction of the buff drive means 50 will be described with reference to FIG. 4.

Figure 4:
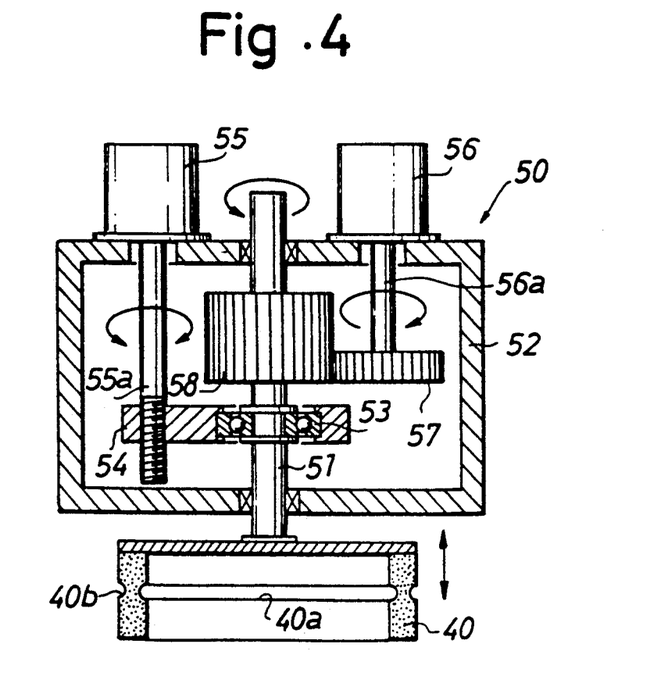
FIG. 4 is a vertical cross section of a buff drive means of the polishing apparatus of the invention.

FIG. 4 is a vertical cross section of the buff drive means 50. The vertical rotatory shaft 51 is passed slidably through the gear case 52, and at its middle portion the shaft 51 is held by a slider 54 via bearing 53 so that the shaft 51 turns independently of the slider 54 but shifts vertically together with the slider 54.

On the top of the gear case 52 are mounted motors 55 and 56. The slider 54 is threadably penetrated by the threaded output shaft 55a extending vertically downward from the motor 55 so that as the output shaft 55a turns the slider 54 is shifted vertically. A horizontal gear 57 is locked about the lower end of the output shaft 56a extending vertically downward from the motor 56, and is meshed with a horizontal large-width gear 58 locked about the rotatory shaft 51 at a location above the bearing 53.

Next, the operation of the wafer chamfers polishing apparatus 1 will be described.

First, the conveyor 2 is driven to run so that one of the wafers W piled in the cassette 5 of the loader assembly A is taken out and sent into the OF position orienting assembly B.

As described already, at the OF position orienting assembly B, the touch rollers 6 are rotated to cause the wafer W to turn circumferentially, and the wafer W is kept turning until the positioning pins 7 touch the OF edge W2 and prevent the turning of the wafer W, whereby the wafer W is oriented. Then, the thus oriented wafer W is sucked and held by the suction cup 4 of the swing arm R1, and as the swing arm R1 swings about the pivot 3, the wafer W at the suction cup 4 is transported from the OF position orienting assembly B to the OF polishing stage C, at which the wafer W is disposed above the suction head 12 of the wafer press means 10, which awaits for the wafer W at the OF polishing stage C. When the suction cup 4 is coaxial with the suction head 12, the former stops sucking and the latter starts sucking so that the wafer W is snatched by the latter.

Meanwhile, the motor 50 drives the shaft 51 to cause the cylindrical buff 40 to descend to a location which the buff 40 drawn in solid line is assuming in FIG. 3. Then, the motor 56 drives the output shaft 56a to turn and the rotational torque is transmitted to the shaft 51 by virtue of the gears 57 and 58, whereupon the cylindrical buff 40 is turned at a predetermined rate in the direction shown by the curved arrow in FIG. 1 (which is clockwise direction).

Next, the air cylinder 18 of the wafer press means 10 drives the rod 18a to withdraw, whereupon the arm 11 turns slightly about the pivot 17 counterclockwise, as viewed in FIG. 1. It is so arranged that the wafer W is level with the external polish groove 40b so that when the wafer W is thus brought to the side of the cylindrical buff 40, the wafer edge enters the running polish groove 40b. Now, it also requires to mention that when the wafer W was oriented at the OF position orienting assembly B it was oriented in a manner such that the straight-line OF edge W2 is orthogonally bisected by the line that connects the center of the wafer W and the center of the circle described by the polishing groove 40b when the wafer W contacts the buff 40. Thus, when the arm 11 turns counterclockwise, the middle portion of OF edge W2 of the wafer W pneumatically held by the suction head 12 of the arm 11 is pressed into the running polish groove 40b of the cylindrical buff 40 with a predetermined pressure.

Figure 5:
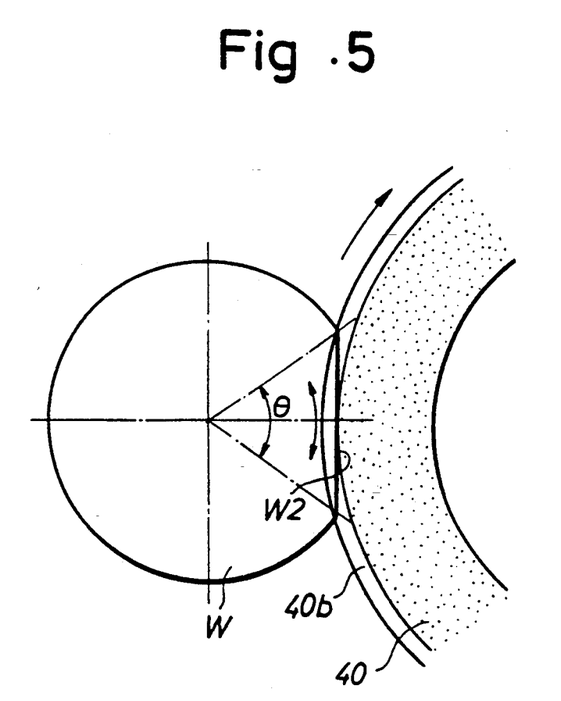
FIG. 5 is a top plan view showing how the orientation flat of a wafer is polished.

Then, the motor 19 is started and it is so arranged that the rotational direction of the motor 19 is alternated periodically, so that the rotational torque generated by the motor 19 is transmitted to the suction head 12 via the pulley 20, belt 22 and pulley 21 and causes the suction head 12 together with the wafer W to turn this way and the other alternately through an angle of $\theta$, as shown in FIG. 5. This angle $\theta$ is an angle included between the radii which connect the center of the wafer W with the end points of the straight-line OF edge W2. As the result, the entire length of the OF edge W2 slides to and fro in the running polish groove 40b formed in the external surface of the cylindrical buff 40. Thus, the chamfers made on the OF edge W2 are all polished evenly until they shine.

Although it is not drawn in any drawings, during this polishing operation, the polish slurry is supplied onto the chamfers of the OF edge W2 to facilitate the buffing efficiency. Incidentally, the servo motor 13, the ball screw mechanism 14 and the rod 15 are provided to enable adjustment of the position of the suction head 12 in the OF polishing stage C so as to cope with the different sizes of the wafers W: for example, when a wafer W has a larger diameter than the previous one, the rod 15 is pulled in a little to bring the suction head 12 back.

Although in the present embodiment the suction head 12 is turned both ways through the angle $\theta$ by the motor 19 to effect uniform polishing of the OF edge W2, it is also possible to arrange such that the swing arm 11 shifts to and fro in its lengthwise direction so that the OF edge W2 reciprocates to and fro tangentially on the contact area of the buff 40, and this shifting can be effected by means of an air cylinder or the like.

When the polishing of the chamfers of the OF edge W2 is completed, the motor 19 is stopped, and the air cylinder 18 is driven again to push out the rod 18a, whereupon the arm 11 is turned clockwise about the pivot 17, as indicated by the arrow drawn in broken line in FIG. 1; thus, the wafer W stops turning and is detached from the buff 40.

Next, the motor 55 of the buff drive means 50, shown in FIG. 4, is started, and its output shaft 55a is driven to turn in such a direction that the slider 54, which is slidable along the threaded portion of the output shaft 55a, is caused to rise vertically along the output shaft 55a; as the result, the rotatory shaft 51 and the cylindrical buff 40, which are integral with the slider 54, ascent, and this ascension is continued until the buff 40 assumes an upper position drawn in two-dot chain line in FIG. 3.

When the cylindrical buff 40 has retreated upward, the swing arm R2 is driven to swing clockwise about the pivot 3 until the center of its suction cup 4 coincides with the center of the wafer W pneumatically held by the suction head 12 of the arm 11, and then the suction head 12 stops sucking at the wafer W and the suction cup 4 starts drawing in the air to thereby snatch the wafer W from the suction head 12. Then, the swing arm R2 is driven further to swing clockwise until the center of its suction cup 4 coincides with the center of suction head 32 of the wafer press means 30, and when they coincide the suction cup 4 stops sucking and the suction head 32 starts sucking whereby the wafer W is snatched by the latter. After thus losing the wafer W to the suction head 32, the swing arm R2 returns to the position it is assuming in FIG. 1.

Thereafter, the motor 55 of the buff drive means 50 is started again, and this time its output shaft 55a is driven to turn in the direction opposite to the direction it turned in on the former occasion so that the slider 54 is caused to descend along the output shaft 55a; as the result, the buff 40 also descends, and this descent is continued until the buff 40 assumes the lower position it is assuming in FIG. 3. Meanwhile the buff 40 is kept turning clockwise as seen in FIG. 1. Incidentally, again it is so arranged that the wafer W pneumatically held by the suction head 32 is level with the internal polish groove 40a so that when the wafer W is brought to the inner wall of the cylindrical buff 40, the wafer edge enters the running polish groove 40a.

Thus, the wafer W is now inside the hollow of the cylindrical buff 40, and as the motor 39, shown in FIG. 1, is started, its rotational torque is transmitted to the suction head 32 in the similar manner as in the case of the motor 19 and the suction head 12; thus, the wafer W held on the suction head 32 is turned clockwise at a predetermined rate which is far lower than the rate at which the buff 40 is turned. Then, the air cylinder 38 of the wafer press means 30 drives the rod 38a to withdraw, whereupon the arm 31 turns slightly about the pivot 37 clockwise, as viewed in FIG. 1. Since the wafer W is held level with the polish groove 40a of the cylindrical buff 40, when the arm 31 turns clockwise and the suction head 32 is thus brought toward the inner wall of the cylindrical buff 40, the circular circumference W1 of the turning wafer W is pressed into the running polish groove 40a with a predetermined pressure. Although the polish groove 40a is running clockwise and the wafer edge clockwise too, the polish groove 40a runs faster than the wafer edge, there occurs differential speed between the two bodies and hence polishing of the chamfers at the circular circumference W1 of the wafer W takes place. This polishing is continued until the chamfers at the circular circumference W1 become glossy. Although it is not shown, during this polishing operation, the polish slurry is supplied onto the chamfers of the wafer W.

Figure 6A:
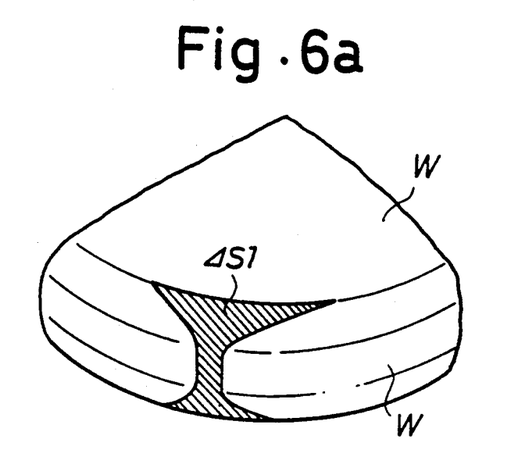
Figure 6B:
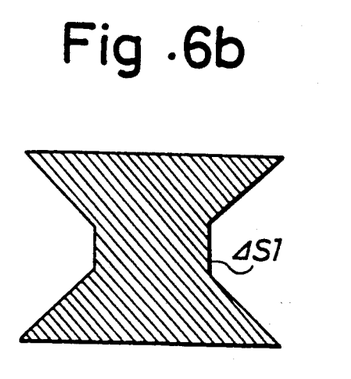
Figure 6C:
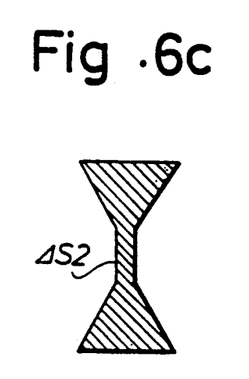

The area of the circular circumference W1 of the wafer W contacted by the internal polish groove 40a of the cylindrical buff 40 at any point of time is shown perspectively and hatched in (a) of FIG. 6, designated by reference ΔS1; when the contact area ΔS1 is developed, we get a figure shown in (b) of FIG. 6, the area of which is much greater than that of the figure ΔS2 in (c) of FIG. 6, which is a development of a contact area in the case of conventional convex-to-convex contact polishing (ΔS1 > ΔS2). Hence, the time efficiency of polishing is higher in the case of the present embodiment of the invention where the polishing groove 40a formed in the inner surface of the hollow cylindrical buff 40 is employed to effect convex-to-concave contact to achieve a wider polishing contact than the case of conventional convex-to-convex contact polishing where the contact area is relatively small (ref. FIG. 10). Thus, in this embodiment of the invention the chamfer polishing is prompted and the required polishing time t is now shortened and a sharp increase in wafer productivity is attained.

When the polishing of the circular circumference W1 of the wafer W is completed, the cylindrical buff 40 is again lifted to the position drawn in two-dot chain line in FIG. 3 in the manner similar to the previous occasion. Then, the swing arm R3 is driven to swing counterclockwise about the pivot 3 until the center of its suction cup 4 coincides with the center of the wafer W pneumatically held by the suction head 32 of the arm 31, and then the suction head 32 stops sucking at the wafer W and the suction cup 4 starts drawing in the air to thereby snatch the wafer W from the suction head 32. Then, the swing arm R3 is driven to swing back till the wafer W is brought above the unloader assembly E, and the wafer W is left there. Thus, a series of polishing operation with respect to the particular wafer W is completed.

As described above, according to this embodiment of the invention, the chamfers of the OF edge W2 and the circular circumference W1 of the wafer W are automatically polished consecutively at different stages. In fact, to improve the wafer productivity, it is arranged such that the OF edge W2 of the next wafer is polished by the polish groove 40b at stage C simultaneously as the circular circumference W1 of the present wafer W is polished by the polish groove 40a inside the buff 40 at stage D, that is, the buff 40 serves two wafers at a time, exactly as FIG. 1 suggests. When the polishing of the respective portions of these wafers is completed and the buff 40 is lifted, the next wafer is transported to the stage D simultaneously as the present wafer W is transported to the unloader assembly E, and a third wafer is brought to the stage C from the assembly B; thus, the time efficiency of the polishing operation is maximized.

Results of the Invention

As is clear from the above description of the invention, since polishing of the circular circumference of each wafer is effected in a convex-to-concave contact manner by means of a polish groove formed inside the hollow cylindrical buff, the polish contact area of the wafer edge at any time point becomes greater than the contact area in the conventional procedure, so that the polishing rate of the buff is improved. Furthermore, according to the embodiment of the invention, the hollow cylindrical buff has an external polishing groove formed in the outer wall of the buff in addition to the internal polishing groove formed in the inner wall; therefore, it is possible to polish two wafers at a time, one with respect to the OF edge and the other with respect to the circular circumference; as the result, the time efficiency of wafer chamfer polishing is heightened and the wafer productivity is improved.

Obviously many modifications and variations of the present invention are possible in the light of the above teachings. It is therefore to be understood that within the scope of the appended claims the invention may be practiced otherwise than is specifically described.

What is claimed is:

1. A method for polishing peripheral chamfers of a semiconductor wafer comprising steps of:
   (a) turning about its axis of rotation at a relatively high rate a cylindrical cup-shaped rotatory buff having an internal polish groove formed in the inner wall surface thereof, said groove describing a circle normal to the axis of rotation of said cylindrical buff and having a profile complementary to the profile of the chamfered wafer edge;
   (b) disposing the wafer inside the turning cylindrical buff in a manner such that the wafer lies in the plane defined by the circle of said internal polish groove;
   (c) turning said wafer circumferentially at a relatively low rate; and
   (d) moving said wafer radially to press the wafer edge into the running internal polish groove with an appropriate pressure.

2. The method as claimed in claim 1 wherein the wafer is one that has a straight-line orientation flat edge and said cylindrical rotatory buff has an external polish groove formed in the outer wall surface thereof describing a circle normal to the axis of rotation of said cylindrical buff and having a profile complementary to the profile of the chamfered wafer edge,
   the method further comprising steps of:
   (i) disposing said wafer outside said cylindrical rotatory buff in a manner such that the wafer lies in the plane defined by the circle of said external polish groove;
   (ii) moving said wafer toward the buff in a manner such that the orientation flat edge of the wafer is contacted by the turning buff in a way that the the orientation flat edge is orthogonally bisected by the line that connects the centers of the wafer and the circle described by said external polish groove, to press the orientation flat edge into the external polish groove with an appropriate pressure; and
   (iii) stroking said orientation flat edge of the wafer on the running external polish groove.

3. The method as claimed in claim 2 wherein at step (iii) the wafer is swung circumferentially at a relatively low rate through the angle included between the radii connecting the center of the wafer with the end points of the orientation flat edge.

4. The method as claimed in claim 2 wherein at step (iii) the wafer is reciprocated repeatedly in a manner such that the entire orientation flat edge is slid on the running external polish groove in a direction generally tangential to the circle of the external polish groove at the contact point.

5. A method for polishing peripheral chamfers of a semiconductor wafer having a straight-line orientation flat edge, making use of a cylindrical cup-shaped rotatory buff having an internal polish groove formed in the inner wall surface thereof and an external polish groove formed in the outer wall surface thereof, said grooves describing circles normal to the axis of rotation of said cylindrical buff and having a profile complementary to the profile of the chamfered wafer edge, comprising stages of:
   (1) picking up one wafer from a plurality of wafers set in a loader assembly and orienting the wafer with respect to its orientation flat edge;
   (2) polishing the chamfers of the orientation flat edge of said wafer by: disposing the wafer outside said buff, which is being turned about its axis of rotation at a relatively high rate, in a manner such that the wafer lies in the plane defined by the circle of said external polish groove; moving said wafer radially to press the orientation flat edge into the running external polish groove with an appropriate pressure; and stroking the orientation flat edge in the external polish groove;
   (3) polishing the chamfers of the circular circumference edge of each wafer by: disposing the wafer inside the turning cup-like buff in a manner such that the wafer lies in the plane defined by the circle of said internal polish groove; turning said wafer circumferentially at a relatively low rate; and moving said wafer radially to press the wafer edge into the running internal polish groove with an appropriate pressure; and
   (4) transporting the wafer after polish to an unloader assembly.

6. A buff for polishing peripheral chamfers of a semiconductor wafer, consisting of a cylindrical cup-shaped rotatory body of a resilient material having an internal polish groove formed in the inner wall surface thereof, said internal polish groove describing a circle normal to the axis of rotation of said cylindrical body and having a profile complementary to the profile of the chamfered wafer edge.

7. A buff as claimed in claim 6 which further has an external polish groove formed in the outer wall surface of the cylindrical cup-shaped rotatory body, said external polish groove describing a circle normal to the axis of rotation of said cylindrical body and having a profile complementary to the profile of the chamfered wafer edge.

8. A buff as claimed in claim 7 wherein the circle described by said external polish groove lies substantially in the same plane as the circle described by said internal polish groove.

9. An apparatus for polishing peripheral chamfers of a semiconductor wafer, comprising:
   a cylindrical cup-shaped rotatory buff having an internal polish groove formed in the inner wall surface thereof, said internal polish groove describing a circle normal to the axis of rotation of said cylindrical buff and having a profile complementary to the profile of the chamfered wafer edge;
   a drive means for turning said buff about its axis of rotation; and
   a wafer holder means for holding the wafer and turning it circumferentially and pressing the wafer edge into the internal polish groove.

10. An apparatus for polishing peripheral chamfers of a semiconductor wafer having a straight-line orientation flat edge, comprising:
   a cylindrical cup-shaped rotatory buff having an internal polish groove formed in the inner wall surface thereof and an external polish groove formed in the outer wall surface thereof, said polish grooves describing circles normal to the axis of rotation of said cylindrical buff and having a profile complementary to the profile of the chamfered wafer edge;
   a drive means for turning said buff about its axis of rotation;
   a first wafer holder means for holding the wafer and pressing the orientation flat edge into the external polish groove and stroking the orientation flat edge on the external polish groove; and
   a second wafer holder means for holding the wafer and turning it circumferentially and pressing the wafer edge into the internal polish groove.

11. An apparatus as claimed in claim 10 wherein the circle described by said external polish groove lies substantially in the same plane as the circle described by said internal polish groove.

12. An apparatus as claimed in claim 10 wherein said first wafer holder means is adapted to swing the wafer circumferentially at a relatively low rate through the angle included between the radii connecting the center of the wafer with the end points of the orientation flat edge.

13. An apparatus as claimed in claim 10 wherein said first wafer holder means is adapted to reciprocate the wafer repeatedly in a manner such that the entire orientation flat edge is slidden on the running external polish groove in a direction generally tangential to the circle of the external polish groove at the contact point.

14. An apparatus as claimed in claim 10, which further comprises:
   a loader assembly for housing a plurality of wafers;
   an orienting means for orienting the wafer with respect to its orientation flat edge;
   a wafer conveyor means for picking up one wafer at a time from the wafers housed in said loader assembly and conveying the wafer to said orienting means;
   an unloader assembly for housing wafers after chamfer polish;
   a plurality of transportation means for transporting one wafer at a time from the orienting means to said wafer holder means, and from said second wafer holder means to said unloader assembly.

* * * * *